US 8,446,500 B2

(12) United States Patent
Suzuki et al.

(10) Patent No.: US 8,446,500 B2
(45) Date of Patent: May 21, 2013

(54) SOLID-STATE IMAGING DEVICE HAVING PHOTOELECTRIC CONVERTING PORTIONS AND FIRST AND SECOND TRANSFER PORTIONS

(75) Inventors: Hisanori Suzuki, Hamamatsu (JP);
Yasuhito Yoneta, Hamamatsu (JP);
Shinya Otsuka, Hamamatsu (JP);
Masaharu Muramatsu, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 151 days.

(21) Appl. No.: 12/990,051

(22) PCT Filed: Apr. 22, 2009

(86) PCT No.: PCT/JP2009/058007
§ 371 (c)(1),
(2), (4) Date: Dec. 1, 2010

(87) PCT Pub. No.: WO2009/133799
PCT Pub. Date: Nov. 5, 2009

(65) Prior Publication Data
US 2011/0075005 A1 Mar. 31, 2011

(30) Foreign Application Priority Data
Apr. 30, 2008 (JP) .............................. P2008-119010

(51) Int. Cl.
*H04N 5/335* (2006.01)
*H01L 27/148* (2006.01)

(52) U.S. Cl.
USPC ........... 348/294; 348/302; 348/303; 348/311; 348/316; 257/222

(58) Field of Classification Search
None
See application file for complete search history.

(56) References Cited

U.S. PATENT DOCUMENTS

| 7,476,841 | B2 * | 1/2009 | Hashimoto et al. | 250/214.1 |
| 2003/0214595 | A1 * | 11/2003 | Mabuchi | 348/294 |
| 2005/0237405 | A1 * | 10/2005 | Ohkawa | 348/308 |

(Continued)

FOREIGN PATENT DOCUMENTS

| CN | 1052974 | 7/1991 |
| CN | 1118522 | 3/1996 |

(Continued)

*Primary Examiner* — Chieh M Fan
*Assistant Examiner* — Dwight C Tejano
(74) *Attorney, Agent, or Firm* — Drinker Biddle & Reath LLP

(57) ABSTRACT

A solid-state imaging device 1 is provided with a plurality of photoelectric converting portions 3 and first and second shift registers 9, 13. Each photoelectric converting portion 3 has a photosensitive region 15 which generates a charge according to incidence of light and which has a planar shape of a nearly rectangular shape composed of two long sides and two short sides, and a potential gradient forming region 17 which forms a potential gradient increasing along a predetermined direction parallel to the long sides forming the planar shape of the photosensitive region 15, in the photosensitive region, 15. The plurality of photoelectric converting portions 3 are juxtaposed along a direction intersecting with the predetermined direction. The first and second shift registers 9, 13 acquire charges transferred from the respective photoelectric converting portions 3 and transfer them in the direction intersecting with the predetermined direction to output them. This achieves the solid-state imaging device capable of quickly reading out the charge generated in the photosensitive region, without complicating image processing.

4 Claims, 9 Drawing Sheets

U.S. PATENT DOCUMENTS

| | | | |
|---|---|---|---|
| 2006/0146154 A1* | 7/2006 | Angal et al. | 348/294 |
| 2008/0049112 A1* | 2/2008 | Lee | 348/222.1 |
| 2008/0088723 A1* | 4/2008 | Furuta et al. | 348/294 |

FOREIGN PATENT DOCUMENTS

| | | |
|---|---|---|
| JP | 58-201473 | 11/1983 |
| JP | 4-127583 | 4/1992 |
| JP | 6-097206 | 4/1994 |
| JP | H6-283704 | 10/1994 |
| JP | 7-169935 | 7/1995 |
| JP | H8-331460 | 12/1996 |
| JP | 9-214837 | 8/1997 |
| JP | H11-027476 | 1/1999 |
| JP | 2005-164363 | 6/2005 |
| JP | 2005-268564 | 9/2005 |

* cited by examiner (a)

(b)

(c)

(d)

(e)

(f)

SOLID-STATE IMAGING DEVICE HAVING PHOTOELECTRIC CONVERTING PORTIONS AND FIRST AND SECOND TRANSFER PORTIONS

TECHNICAL FIELD

The present invention relates to a solid-state imaging device.

BACKGROUND ART

There is a known solid-state imaging device wherein a plurality of photoelectric converting portions, each of which has a photosensitive region configured to generate a charge according to incidence of light and having a planar shape of a nearly rectangular shape composed of two long sides and two short sides, are arranged in an array form in a one-dimensional direction (direction along the short side direction of the photosensitive region) (e.g., cf. Patent Document 1). The solid-state imaging device of this type has been used heretofore in various uses and is commonly used, particularly, as a light detecting means of a spectroscope.

Patent Document 1: Japanese Patent Application Laid-open No. 2005-164363

DISCLOSURE OF THE INVENTION

Problem to be Solved by the Invention

However, the solid-state imaging device described in Patent Document 1 has the following problem. In the solid-state imaging device described in Patent Document 1, a charge generated in the photosensitive region is read out from the short side of the photosensitive region. For this reason, the generated charge needs to migrate in the long side direction of the photosensitive region and a migration distance thereof is long. As a result of this, it becomes difficult to quickly read out the generated charge.

In the solid-state imaging device described in Patent Document 1, a diffusion region for accumulation of charge and an amplifier region for amplifying and outputting a voltage signal generated in the diffusion region are arranged adjacent to each of a pair of short sides of the photosensitive region. Namely, since the solid-state imaging device described in Patent Document 1 is configured to output respective signals from a pair of amplifier regions arranged adjacent to the respective short sides of the photosensitive region, it is necessary to execute signal processing for obtaining a one-dimensional image, whereby image processing could become complicated.

An object of the present invention is therefore to provide a solid-state imaging device capable of quickly reading out the charge generated in the photosensitive region, without complicating image processing.

Means for Solving the Problem

A solid-state imaging device according to the present invention comprises a plurality of photoelectric converting portions, each having a photosensitive region which generates a charge according to incidence of light and which has a planar shape of a nearly rectangular shape composed of two long sides and two short sides, and a potential gradient forming region which forms a potential gradient increasing along a predetermined direction parallel to the long sides forming the planar shape of the photosensitive region, in the photosensitive region, the plurality of photoelectric converting portions being juxtaposed along a direction intersecting with the predetermined direction; and first and second charge output portions which acquire charges transferred from the respective photoelectric converting portions and which transfer the charges in the direction intersecting with the predetermined direction to output the charges.

In the solid-state imaging device according to the present invention, since in each photoelectric converting portion the potential gradient forming region forms the potential gradient increasing along the predetermined direction, a charge generated in the photosensitive region migrates toward either short side along a slope of potential according to the potential gradient formed. This makes the charge migration speed dominated by the potential gradient (slope of potential), so as to increase the charge readout speed.

In the present invention, the charges transferred from the plurality of photoelectric converting portions are acquired by the first or second charge output portion to be transferred in the direction intersecting with the predetermined direction to be output. As a result of this, the present invention eliminates the need for executing further signal processing for obtaining a one-dimensional image, which was required in the conventional technology, and thus can prevent the image processing from becoming complicated.

Incidentally, in the present invention, the photosensitive region has the planar shape of the nearly rectangular shape composed of two long sides and two short sides. For this reason, a saturated charge quantity is large in the photosensitive region.

Preferably, the potential gradient forming region forms the potential gradient increasing along a first direction directed from one short side to the other short side forming the planar shape of the photosensitive region, as the predetermined direction; the first and second charge output portions are arranged on the side of the other short side forming the planar shape of the photosensitive region; the solid-state imaging device further comprises: a plurality of first transfer portions, each being arranged corresponding to the photoelectric converting portion and between each photoelectric converting portion and the first charge output portion, and each transferring a charge from the photosensitive region of the corresponding photoelectric converting portion to the first charge output portion; and a plurality of second transfer portions, each being arranged corresponding to the photoelectric converting portion and between each first charge output portion and the second charge output portion, and each transferring a charge transferred to the first charge output portion, to the second charge output portion.

Since the potential gradient forming region forms the potential gradient increasing along the first direction, the charge generated in the photosensitive region migrates toward the other short side along a slope of potential according to the potential gradient formed. The charge having migrated to the other short side is acquired by the first transfer portion to be transferred in the first direction. The charges transferred from the respective first transfer portions are transferred in the direction intersecting with the first direction and output by the first charge output portion. The second transfer portion transfers the charge accumulated in the first charge output portion, in the first direction. The charges transferred from the respective second transfer portions are transferred in the direction intersecting with the first direction and output by the second charge output portion.

Preferably, the potential gradient forming region selectively forms the potential gradient increasing along either one direction of a first direction directed from one short side to the other short side forming the planar shape of the photosensitive region and a second direction directed from the other short side to one short side forming the planar shape of the photosensitive region, as the predetermined direction; the first charge output portion is arranged on the side of one short side forming the planar shape of the photosensitive region; the second charge output portion is arranged on the side of the other short side forming the planar shape of the photosensitive region; the solid-state imaging device further comprises: a plurality of first transfer portions, each being arranged corresponding to the photoelectric converting portion and between each photoelectric converting portion and the first charge output portion, and each transferring a charge from the photosensitive region of the corresponding photoelectric converting portion to the first charge output portion; and a plurality of second transfer portions, each being arranged corresponding to the photoelectric converting portion and between each photoelectric converting portion and the second charge output portion, and each transferring a charge from the photosensitive region of the corresponding photoelectric converting portion to the second charge output portion.

When the potential gradient forming region forms the potential gradient increasing along the second direction, a charge generated in the photosensitive region migrates toward one short side along a slope of potential according to the potential gradient formed. The charge having migrated to one short side is acquired by the first transfer portion to be transferred in the second direction. The charges transferred from the respective first transfer portions are transferred in the direction intersecting with the first direction and output by the first charge output portion. When the potential gradient forming region forms the potential gradient increasing along the first direction, a charge generated in the photosensitive region migrates toward the other short side along a slope of potential according to the potential gradient formed. The charge having migrated to the other short side is acquired by the second transfer portion to be transferred in the first direction. The charges transferred from the respective second transfer portions are transferred in the direction intersecting with the second direction and output by the second charge output portion.

More preferably, the second charge output portion acquires charges generated in the photoelectric converting portions, from the plurality of second transfer portions during a first period and transfers the charges in the direction intersecting with the predetermined direction to output the charges, and the first charge output portion acquires charges generated in the photoelectric converting portions, from the plurality of first transfer portions during a second period shorter than the first period and transfers the charges in the direction intersecting with the predetermined direction to output the charges.

When the charge generated in the photoelectric converting portion during the first period is accumulated, an exposure time is relatively long and therefore strong incident light causes saturation of a signal and makes appropriate detection thereof difficult; weak incident light is detected as a sufficiently large signal. When the charge generated in the photoelectric converting portion during the second period is accumulated, an exposure time is relatively short and therefore weak incident light leads to a very weak signal and makes sufficient signal detection difficult; strong incident light is appropriately detected as a signal, without saturation. In this manner, the incident light is appropriately detected as a signal, regardless of the intensity of incident light, so as to increase the effective dynamic range.

In the present invention, since the device is provided with the first and second charge output portions, they prevent the transfer of the charge generated in the photoelectric converting portion during the second period and the transfer of the charge generated in the photoelectric converting portion during the first period from impeding each other.

EFFECT OF THE INVENTION

The present invention successfully provides the solid-state imaging device capable of quickly reading out the charge generated in the photosensitive region, without complicating image processing.

DESCRIPTION OF THE SYMBOLS

1 solid-state imaging device; 3 photoelectric converting portions; 5 buffer gate portions; 7 first transfer portions; 9 first shift register; 11 second transfer portions; 13 second shift register; 15 photosensitive regions; 17 potential gradient forming regions; 23 amplifier portion; 61 solid-state imaging device; 62 first buffer gate portions; 63 first transfer portions; 65 second shift register; 66 second buffer gate portions; 67 second transfer portions; 69 second shift register.

BEST MODE FOR CARRYING OUT THE INVENTION

The preferred embodiments of the present invention will be described below in detail with reference to the accompanying drawings. In the description the same elements or elements with the same functionality will be denoted by the same reference symbols, without redundant description.

(First Embodiment)

Figure 1:
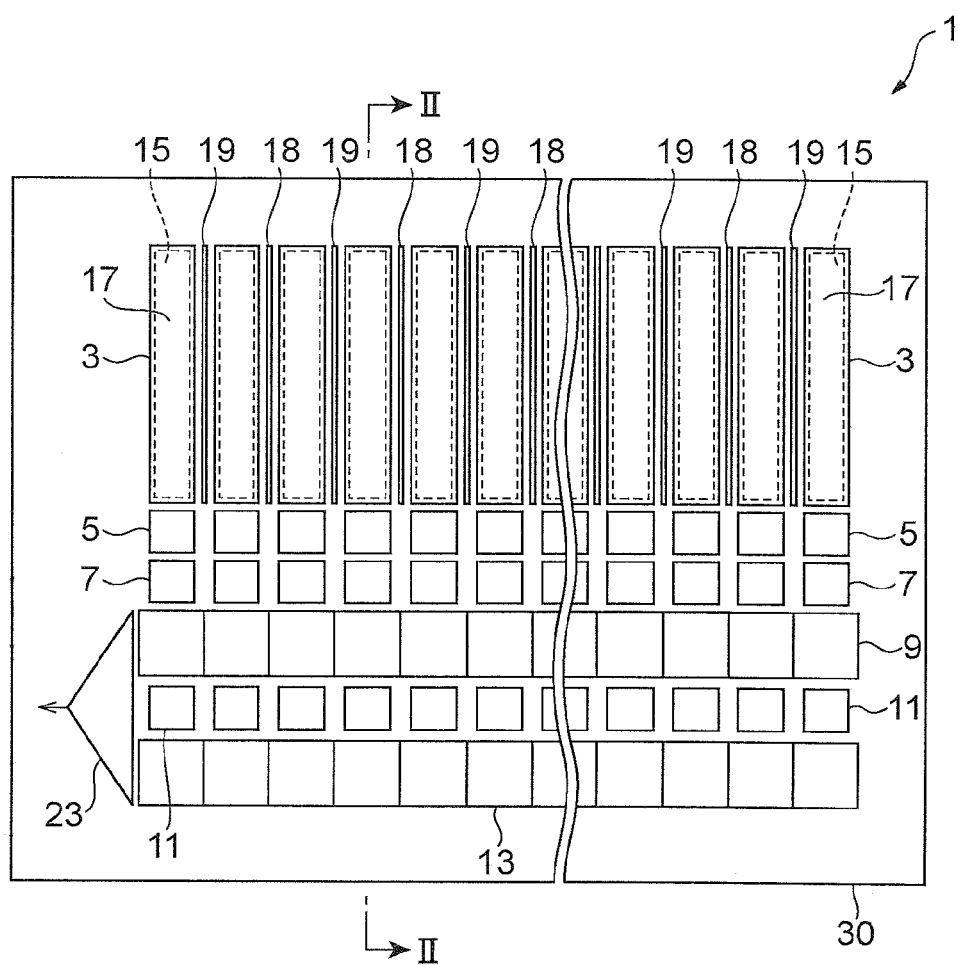
FIG. 1 is a drawing showing a configuration of a solid-state imaging device according to the first embodiment.
Figure 2:
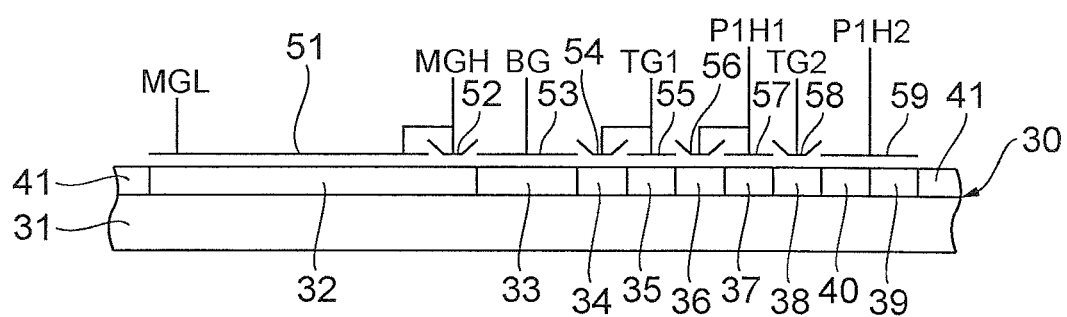
FIG. 2 is a drawing for explaining a sectional configuration along line II-II in FIG. 1.

FIG. 1 is a drawing showing a configuration of a solid-state imaging device according to the first embodiment. FIG. 2 is a drawing for explaining a sectional configuration along line II-II in FIG. 1.

The solid-state imaging device 1 according to the first embodiment is provided with a plurality of photoelectric converting portions 3, a plurality of buffer gate portions 5, a plurality of first transfer portions 7, a first shift register 9 as a first charge output portion, a plurality of second transfer portions 11, and a second shift register 13 as a second charge output portion. The solid-state imaging device 1 can be used as a light detecting means of a spectroscope.

Each photoelectric converting portion 3 has a photosensitive region 15 and a potential gradient forming region 17. The photosensitive region 15 senses incidence of light to generate a charge according to an intensity of incident light. The potential gradient forming region 17 forms a potential gradient increasing along a first direction (direction along the long side direction of the photosensitive region 15) directed from one short side to the other short side forming a planar shape of the photosensitive region 15, in the photosensitive region 15. The potential gradient forming region 17 discharges a charge generated in the photosensitive region 15, from the other short side of the photosensitive region 15.

The planar shape of the photosensitive region 15 is a nearly rectangular shape composed of two long sides and two short sides. The plurality of photoelectric converting portions 3 are juxtaposed along a direction intersecting with the first direction (e.g., perpendicular thereto) and are arranged in an array form in a one-dimensional direction. The plurality of photoelectric converting portions 3 are juxtaposed in a direction along the short side direction of the photosensitive region 15. In the present embodiment the length in the long side direction of the photosensitive region 15 is set, for example, at about 1 mm, and the length in the short side direction of the photosensitive region 15 is set, for example, at about 24 μm.

For each photosensitive region 15, an isolation region 18 and an overflow drain (OFD) region 19 are arranged so as to interpose the photosensitive region 15 between them in the direction along the short side direction of the photosensitive region 15. The isolation region 18 extends in a direction along the long side direction of the photosensitive region 15, while being arranged adjacent to one long side of the photosensitive region 15. The isolation region 18 electrically isolates a pair of photosensitive regions 15 arranged adjacent to each other with the isolation region 18 in between.

The overflow drain region 19 extends in the direction along the long side direction of the photosensitive region 15, while being arranged adjacent to the other long side of the photosensitive region 15. The overflow drain region 19 includes an overflow gate (OFG) composed of a gate transistor, and when a charge is generated over a storage capacitance of the photosensitive region 15 in the photosensitive region 15, the overflow drain region 19 discharges an excess charge over the storage capacitance. This prevents inconvenience such as blooming, a phenomenon in which a charge overflowing from the photosensitive region 15 over the storage capacitance leaks into another photosensitive region 15.

Each buffer gate portion 5 is arranged corresponding to a photoelectric converting portion 3 and on the side of the other short side forming the planar shape of the photosensitive region 15. Namely, the plurality of buffer gate portions 5 are juxtaposed in the direction intersecting with the first direction (or in a direction along the short side direction of the photosensitive region 15), on the side of the other short side forming the planar shape of the photosensitive region 15. The buffer gate portion 5 is interposed between the photoelectric converting portion 3 (photosensitive region 15) and the first transfer portion 7. In the present embodiment, a charge discharged from the photosensitive region 15 by the potential gradient forming region 17 is accumulated in the buffer gate portion 5. An isolation region (not shown) is arranged between adjacent buffer gate portions 5 to substantialize electrical isolation between the buffer gate portions 5.

Each first transfer portion 7 is arranged corresponding to a buffer gate portion 5 and between the buffer gate portion 5 and the first shift register 9. Namely, the plurality of first transfer portions 7 are juxtaposed in the direction intersecting with the first direction, on the side of the other short side forming the planar shape of the photosensitive region 15. The first transfer portion 7 acquires a charge accumulated in the buffer gate portion 5 and transfers the acquired charge in the first direction, i.e., toward the first shift register 9. An isolation region (not shown) is arranged between adjacent first transfer portions 7 to substantialize electrical isolation between the first transfer portions 7.

The first shift register 9 is arranged to the plurality of first transfer portions 7 so as to be adjacent in the first direction to each of the first transfer portions 7. Namely, the first shift register 9 is arranged on the side of the other short side forming the planar shape of the photosensitive region 15. The first shift register 9 receives charges transferred from the respective first transfer portions 7 and transfers the charges in the direction intersecting with the first direction to sequentially output them to an amplifier portion 23. The charges output from the first shift register 9 are converted into voltages by the amplifier portion 23 and the amplifier portion 23 outputs the voltages of the respective photoelectric converting portions 3 (photosensitive regions 15) juxtaposed in the direction intersecting with the first direction, to the outside of the solid-state imaging device 1.

Each second transfer portion 11 is arranged corresponding to a buffer gate portion 5 and between the first shift register 9 and the second shift register 13. Namely, the plurality of second transfer portions 11 are juxtaposed in the direction intersecting with the first direction, on the side of the other short side forming the planar shape of the photosensitive region 15. The second transfer portion 11 acquires a charge accumulated in a corresponding region of the first shift register 9 and transfers the acquired charge in the first direction, i.e., toward the second shift register 13. An isolation region (not shown) is arranged between adjacent second transfer portions 11 to substantialize electrical isolation between the second transfer portions 11.

The second shift register 13 is arranged to the plurality of second transfer portions 11 so as to be adjacent in the first direction to each of the second transfer portions 11. Namely, the second shift register 13 is arranged on the side of the other short side forming the planar shape of the photosensitive region 15, as the first shift register 9 is. The second shift register 13 receives charges transferred from the respective second transfer portions 11 and transfers the charges in the direction intersecting with the first direction to sequentially output them to the amplifier portion 23. The charges output from the second shift register 13 are converted into voltages by the amplifier portion 23 and the amplifier portion 23 outputs the voltages of the respective photoelectric converting portions 3 (photosensitive regions 15) juxtaposed in the direction intersecting with the first direction, to the outside of the solid-state imaging device 1.

The plurality of photoelectric converting portions 3, the plurality of buffer gate portions 5, the plurality of first transfer portions 7, the first shift register 9, the plurality of second transfer portions 11, and the second shift register 13 are formed on a semiconductor substrate 30, as shown in FIG. 2. The semiconductor substrate 30 includes a p-type semiconductor layer 31 as a base of the semiconductor substrate 30, n-type semiconductor layers 32, 33, 35, 37, and 39, $n^-$-type semiconductor layers 34, 36, 38, and 40, and a $p^+$-type semiconductor layer 41 which are formed on one side of the p-type semiconductor layer 31. In the present embodiment, Si is used as a semiconductor, "high impurity concentration" refers, for example, to an impurity concentration of not less than about $1 \times 10^{17}$ cm$^{-3}$ and is indicated by "+" attached to the conductivity type, and "low impurity concentration" refers to an impurity concentration of not more than about $1 \times 15^{15}$ cm$^{-3}$ and is indicated by "−" attached to the conductivity type. An n-type impurity is, for example, arsenic and a p-type impurity is, for example, boron.

The p-type semiconductor layer 31 and the n-type semiconductor layer 32 form a pn junction and the n-type semiconductor layer 32 constitutes the photosensitive region 15 which generates a charge with incidence of light. The n-type semiconductor layer 32, on a plan view, is of a nearly rectangular shape composed of two long sides and two short sides. A plurality of n-type semiconductor layers 32 are juxtaposed along the direction intersecting with the foregoing first direction (i.e., the direction along the long side direction of the n-type semiconductor layer 32 as directed from one short side to the other short side forming the planar shape of the n-type semiconductor layer 32) and are arranged in an array form in a one-dimensional direction. The n-type semiconductor layers 32 are juxtaposed in a direction along the short side direction of the n-type semiconductor layer 32. The aforementioned isolation region 19 can be composed of a p$^+$-type semiconductor layer.

A pair of electrodes 51, 52 are arranged for the n-type semiconductor layer 32. The pair of electrodes 51, 52 are made of an optically transparent material, e.g., a polysilicon film and are formed through an insulating layer (not shown) on the n-type semiconductor layer 32. The pair of electrodes 51, 52 constitute the potential gradient forming region 17. The electrodes 51, 52 may be formed as continuously extending in the direction intersecting with the first direction so as to stretch across a plurality of n-type semiconductor layers 32 juxtaposed along the direction intersecting with the first direction. Of course, the electrodes 51, 52 may be formed for each of the n-type semiconductor layers 32.

The electrode 51 constitutes a so-called resistive gate and is formed so as to extend in the direction (the aforementioned first direction) directed from one short side to the other short side forming the planar shape of the n-type semiconductor layer 32. The electrode 51 is given a constant potential difference at its two ends, to form a potential gradient according to an electric resistance component in the first direction of the electrode 51, i.e., a potential gradient increasing along the first direction. A control circuit (not shown) supplies a signal MGL to one end of the electrode 51 and the control circuit (not shown) supplies a signal MGH to the other end of the electrode 51 and to the electrode 52. When the signal MGL is L level and MGH is H level, the potential gradient increasing along the foregoing first direction is formed in the n-type semiconductor layer 32.

An electrode 53 is arranged adjacent in the first direction to the electrode 52. The electrode 53 is formed through an insulating layer (not shown) on the n-type semiconductor layer 33. The n-type semiconductor layer 33 is arranged on the side of the other short side forming the planar shape of the n-type semiconductor layer 32. The electrode 53 is comprised, for example, of a polysilicon film. The electrode 53 is given a signal BG from the control circuit (not shown). The electrode 53 and the n-type semiconductor layer 33 below the electrode 53 constitute the buffer gate portion 5.

Transfer electrodes 54, 55 are arranged adjacent in the first direction to the electrode 53. The transfer electrodes 54, 55 are formed through an insulating layer (not shown) on the n$^-$-type semiconductor layer 34 and on the n-type semiconductor layer 35, respectively. The n$^-$-type semiconductor layer 34 and the n-type semiconductor layer 35 are arranged adjacent in the first direction to the n-type semiconductor layer 33. The transfer electrodes 54, 55 are comprised, for example, of a polysilicon film. The transfer electrodes 54, 55 are given a signal TG1 from the control circuit (not shown). The transfer electrodes 54, 55 and the n$^-$-type semiconductor layer 34 and n-type semiconductor layer 35 below the transfer electrodes 54, 55 constitute the first transfer portion 7.

A pair of transfer electrodes 56, 57 are arranged adjacent in the first direction to the transfer electrode 55. The transfer electrodes 56, 57 are formed through an insulating layer (not shown) on the n$^-$-type semiconductor layer 36 and on the n-type semiconductor layer 37, respectively. The n$^-$-type semiconductor layer 36 and the n-type semiconductor layer 37 are arranged adjacent in the first direction to the n-type semiconductor layer 35. The transfer electrodes 56, 57 are comprised, for example, of a polysilicon film. The transfer electrodes 56, 57 are given a signal P1H1 or the like from the control circuit (not shown). The transfer electrodes 56, 57 and the n$^-$-type semiconductor layer 36 and n-type semiconductor layer 37 below the transfer electrodes 56, 57 constitute the first shift register 9.

A transfer electrode 58 is arranged adjacent in the first direction to the transfer electrode 57. The transfer electrode 58 is formed through an insulating layer (not shown) on the n$^-$-type semiconductor layer 38. The n$^-$-type semiconductor layer 38 is arranged adjacent in the first direction to the n-type semiconductor layer 37. The transfer electrode 58 is comprised, for example, of a polysilicon film. The transfer electrode 58 is given a signal TG2 from the control circuit (not shown). The transfer electrode 58 and the n$^-$-type semiconductor layer 38 under the transfer electrode 58 constitute the second transfer portion 11.

A transfer electrode 59 is arranged adjacent in the first direction to the transfer electrode 58. The transfer electrode 59 is formed through an insulating layer (not shown) on the n$^-$-type semiconductor layer 40 and the n-type semiconductor layer 39. The n$^-$-type semiconductor layer 40 is arranged adjacent in the first direction to the n$^-$-type semiconductor layer 38. The n-type semiconductor layer 39 is arranged adjacent in the first direction to the n$^-$-type semiconductor layer 40. The transfer electrode 59 is comprised, for example, of a polysilicon film. The transfer electrode 59 is given a signal P1H2 or the like from the control circuit (not shown). The transfer electrode 59 and the n$^-$-type semiconductor layer 40 and n-type semiconductor layer 39 below the transfer electrode 59 constitute the second shift register 13.

The p$^+$-type semiconductor layer 41 electrically isolates the n-type semiconductor layers 32, 33, 35, 37, 39 and the n$^-$-type semiconductor layers 34, 36, 38, 40 from the other portions of the semiconductor substrate 30. Each of the aforementioned insulating layers is made of an optically transparent material, e.g., a silicon oxide film. In order to prevent occurrence of unwanted charge, the n-type semiconductor layers 33, 35, 37, 39 and the n$^-$-type semiconductor layers 34, 36, 38, 40 (buffer gate portion 5, first transfer portion 7, first shift register 9, second transfer portion 11, and second shift register 13) except for the n-type semiconductor layer 32 are preferably shielded from light, for example, by arranging a light shield member.

Figure 3:
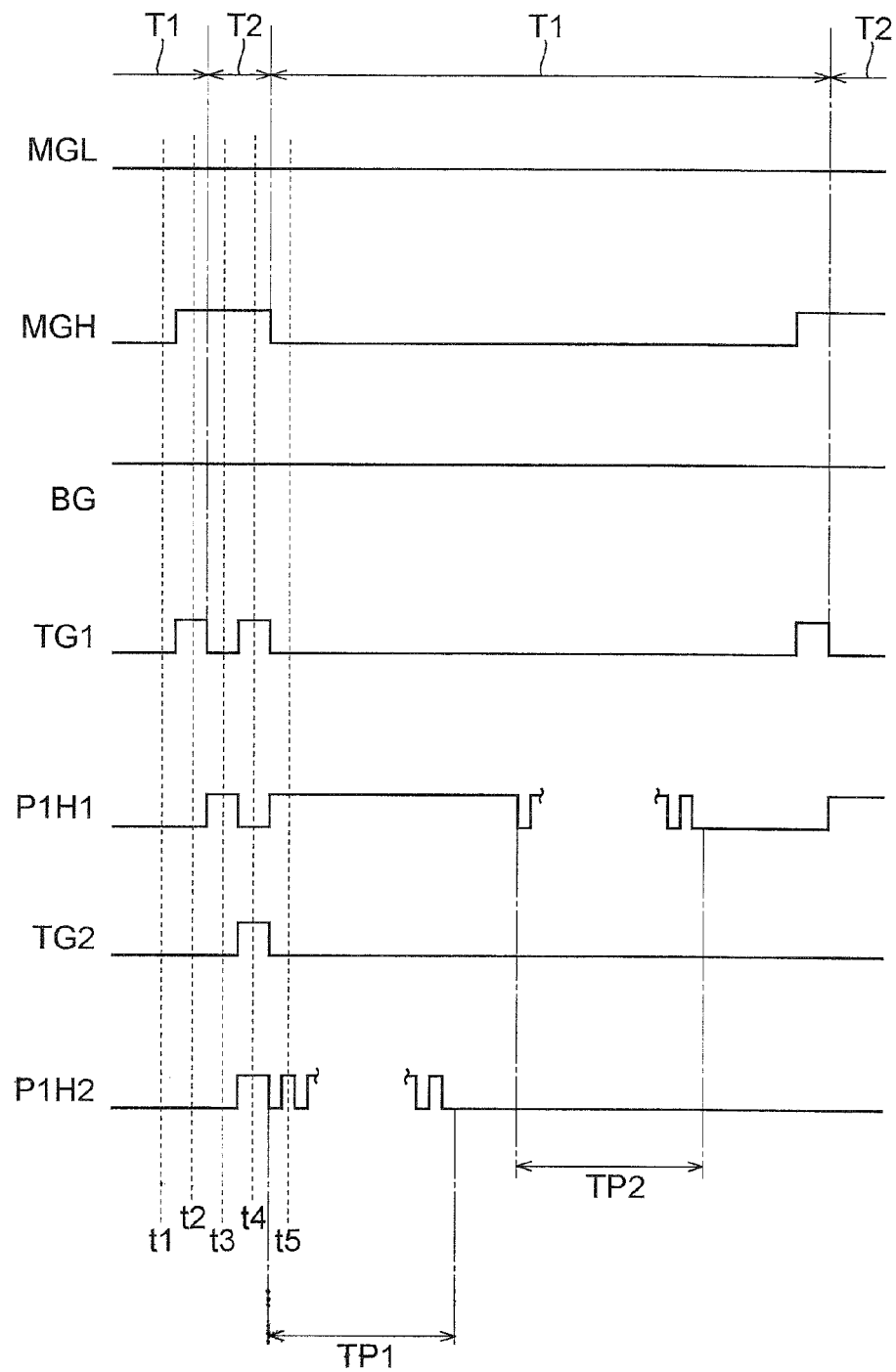
FIG. 3 is a timing chart of input signals in the solid-state imaging device of the first embodiment.
Figure 4:
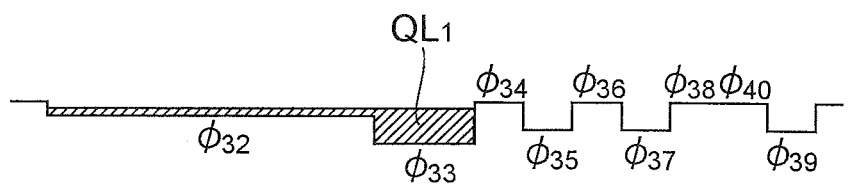
FIG. 4 is potential diagrams for explaining charge accumulation and discharge operations at respective times in FIG. 3.
Figure 4:
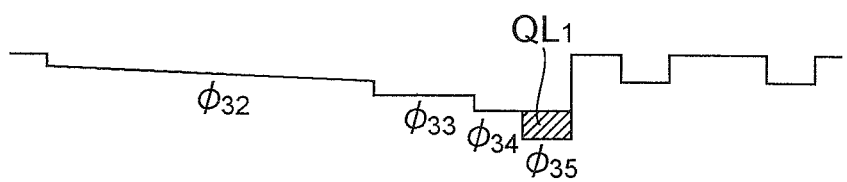
Figure 4:
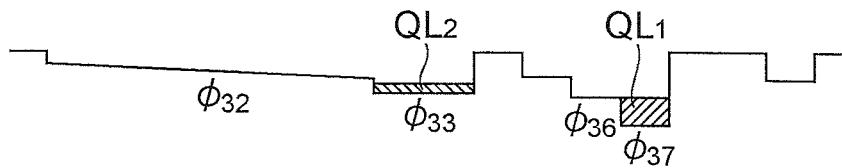
Figure 4:
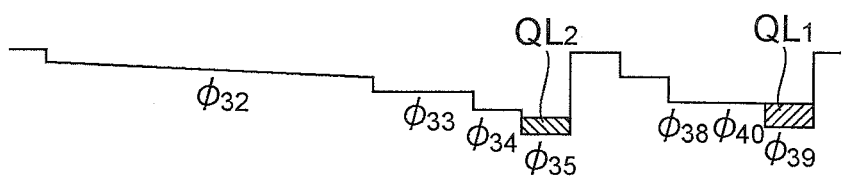
Figure 4:
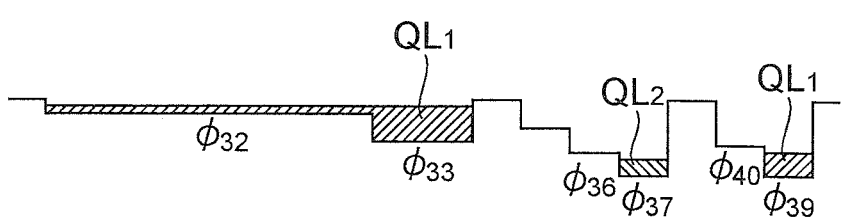

The operations in the solid-state imaging device 1 will be described below on the basis of FIGS. 3 and 4. FIG. 3 is a timing chart of the signals MGL, MGH, BG, TG1, P1H1, TG2, and P1H2 fed to the electrodes 51-59 in the solid-state imaging device 1 of the present embodiment. FIG. 4(a) to (e) are potential diagrams for explaining charge accumulation and discharge operations at respective times t1-t5 in FIG. 3.

Incidentally, positively ionized donors exist in an n-type semiconductor and negatively ionized acceptors exist in a p-type semiconductor. The potential in the n-type semiconductor becomes higher than that in the p-type semiconductor. In other words, the potential in an energy band diagram is positive in the downward direction and therefore the potential in the n-type semiconductor becomes deeper (or higher) than the potential in the p-type semiconductor in the energy band diagram and has a lower energy level. When a positive potential is applied to each electrode, a potential of a semiconductor region immediately below the electrode becomes deeper (or increases in the positive direction). When the magnitude of the positive potential applied to each electrode is reduced, the potential of the semiconductor region immediately below the corresponding electrode becomes shallower (or decreases in the positive direction).

As shown in FIG. 3, at time t1 the signals MGL, MGH, TG1, P1H1, TG2, P1H2 are L level and the signal BG is H level, whereby the potential $\Phi_{33}$ of the n-type semiconductor layer 33 is deeper than the potential $\Phi_{34}$ of the n-type semiconductor layer 34, thus forming wells of the potentials $\Phi_{32}$, $\Phi_{33}$ (cf. FIG. 4(a)). In this state, when light is incident to the n-type semiconductor layer 32 to generate a charge, the generated charge is accumulated in the wells of the potentials $\Phi_{32}$, $\Phi_{33}$. A charge quantity $QL_1$ is accumulated in the potentials $\Phi_{32}$, $\Phi_{33}$.

Figure 5:
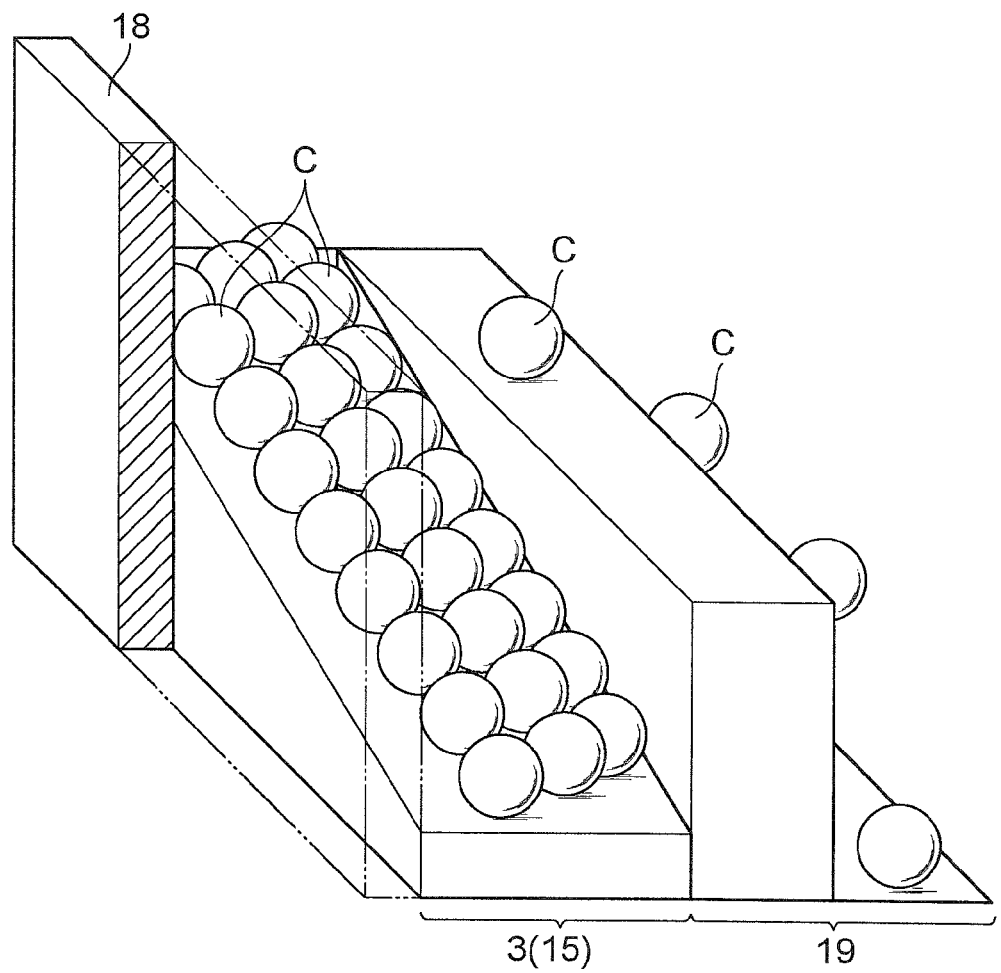
FIG. 5 is a schematic diagram for explaining migration of charge in a photoelectric converting portion.

At time t2, the signal MGH is H level, whereby a potential gradient increasing in the first direction is formed in the n-type semiconductor layer 32 and the potential $\Phi_{32}$ is inclined so as to deepen toward the n⁻-type semiconductor layer 33, thereby forming the gradient of the potential $\Phi_{32}$ (cf. FIG. 4(b)). At the same time t2, the signal TG1 is H level to deepen the respective potentials $\Phi_{34}$, $\Phi_{35}$ of the n⁻-type semiconductor layer 34 and the n-type semiconductor layer 35 to form a well of the potential $\Phi_{35}$. The charge accumulated in the well of the potential $\Phi_{32}$ migrates along the gradient of the potential $\Phi_{32}$, as also shown in FIG. 5, and is transferred, together with the charge accumulated in the well of the potential $\Phi_{33}$, into the well of the potential $\Phi_{35}$. The charge quantity $QL_1$ is accumulated in the potential $\Phi_{35}$.

At time t3, the signal TG1 is L level to make the potentials $\Phi_{34}$, $\Phi_{35}$ shallower. This results in forming wells of the potentials $\Phi_{32}$, $\Phi_{33}$. At this time, the state in which the gradient of the potential $\Phi_{32}$ is formed is maintained, and the generated charge is accumulated in the well of the potential $\Phi_{33}$. A charge quantity $QL_2$ is accumulated in the potential $\Phi_{32}$ (cf. FIG. 4 (c)). At time t3, the signal P1H1 is H level to deepen the respective potentials $\Phi_{36}$, $\Phi_{37}$ of the n⁻-type semiconductor layer 36 and the n-type semiconductor layer 37 to form a well of the potential $\Phi_{37}$. The charge accumulated in the well of the potential $\Phi_{35}$ is transferred into the well of the potential $\Phi_{37}$. The charge quantity $QL_1$ is accumulated in the potential $\Phi_{37}$.

At time t4, the signal TG1 is H level and the signal P1H1 is L level, to form the well of potential $\Phi_{35}$ (cf. FIG. 4(d)). This causes the charge accumulated in the well of the potential $\Phi_{33}$ to be transferred into the well of the potential $\Phi_{35}$. The charge quantity $QL_2$ is accumulated in the potential $\Phi_{35}$.

At the same time t4, the signals TG2, P1H2 are H level to deepen the respective potentials $\Phi_{38}$, $\Phi_{40}$, $\Phi_{39}$ of the n⁻-type semiconductor layers 38, 40 and the n-type semiconductor layer 39 to form a well of the potential $\Phi_{39}$. The charge accumulated in the well of the potential $\Phi_{37}$ is transferred into the well of the potential $\Phi_{39}$. The charge quantity $QL_1$ is accumulated in the potential $\Phi_{39}$. After this, the charge in the charge quantity $QL_1$ is sequentially transferred in the direction intersecting with the first direction, during a charge transfer period TP1, to be output to the amplifier portion 23. Although omitted from the illustration in FIG. 3, a signal for transferring the charge quantity $QL_1$ in the direction intersecting with the first direction is fed as signal P1H2 or the like during the charge transfer period TP1.

At time t5, the signal MGH is L level and the signal TG1 is L level, to eliminate the gradient of the potential $\Phi_{32}$ and form the wells of the potentials $\Phi_{32}$, $\Phi_{33}$ as at time t1 (cf. FIG. 4(e)). This causes the generated charge to be accumulated in the wells of the potentials $\Phi_{32}$, $\Phi_{33}$ as at time t1. At the same time t5, the signal P1H1 is H level, whereby the well of the potential $\Phi_{37}$ is formed as at time t3. The charge accumulated in the well of the potential $0_{35}$ is transferred into the well of the potential $\Phi_{37}$. The charge quantity $QL_2$ is accumulated in the potential $\Phi_{37}$. After this, the charge in the charge quantity $QL_2$ is sequentially transferred in the direction intersecting with the first direction, during a charge transfer period TP2, to be output to the amplifier portion 23. Although omitted from the illustration in FIG. 3, a signal for transferring the charge quantity $QL_2$ in the direction intersecting with the first direction is fed as signal P1H1 or the like during the charge transfer period TP2.

In the present embodiment, as described above, the planar shape of the photosensitive region 15 is the nearly rectangular shape composed of two long sides and two short sides. In this case, the length in the long side direction of the photosensitive region 15 can be made long to increase a saturated charge quantity in each photosensitive region 15, thereby enabling an improvement in SN ratio.

The plurality of photoelectric converting portions 3 are juxtaposed along the direction intersecting with the first direction and are arranged in the array form in the one-dimensional direction. In the present embodiment the plurality of photoelectric converting portions 3 are juxtaposed in the direction along the short side direction of the photosensitive region 15. Since in each photoelectric converting portion 3 the potential gradient increasing along the first direction is formed by the electrode 51, the charge generated in the photosensitive region 15 migrates toward the other short side along the slope of potential according to the potential gradient formed. This makes the charge migration speed dominated by the potential gradient (slope of potential), so as to increase the charge readout speed.

The charge having migrated to the other short side is accumulated in the buffer gate portion 5. The charge accumulated in the buffer gate portion 5 is acquired by the first transfer portion 7 to be transferred in the first direction. Then the charges transferred from the respective first transfer portions 7 are transferred in the direction intersecting with the first direction by the first shift register 9 to be output. The second transfer portions 11 transfer the charges accumulated in the first shift register 9, in the first direction. Then the charges transferred from the respective second transfer portions 11 are transferred in the direction intersecting with the first direction by the second shift register 13 to be output. The charges transferred from the plurality of photoelectric converting portions 3 are acquired by the first or second shift register 9 or 13 to be transferred in the direction intersecting with the first direction. As a result of this, the solid-state imaging device 1 does not have to execute further signal processing for obtaining a one-dimensional image, whereby image processing can be prevented from becoming complicated.

In the present embodiment, the photosensitive region 15 has the planar shape of the nearly rectangular shape composed of two long sides and two short sides. As a result of this, the saturated charge quantity in the photosensitive region 15 is large.

In the present embodiment, the charge (charge quantity $QL_1$) generated in the photoelectric converting portion 3

(photosensitive region 15) during the first period (period T1 in FIG. 3) and the charge (charge quantity $QL_2$) generated in the photoelectric converting portion 3 (photosensitive region 15) during the second period (period T2 in FIG. 3) shorter than the first period T1 are continuously and alternately output. Namely, in the present embodiment, the sum of the first period T1 and the second period T2 is defined as one readout period, in which charges generated in the photoelectric converting portion 3 are accumulated and output. In the present embodiment, the charge generated in the photoelectric converting portion 3 during the first period is read out in the charge transfer period TP1 and the charge generated in the photoelectric converting portion 3 during the second period is read out in the charge transfer period TP2. In the present embodiment, the first period T1 is set, for example, at about 9.99 ms, the second period T2 is set, for example, at about 10 µs, and thus the first period T1 is approximately 1000 times the second period T2.

In the case where the first period T1 is set at 9.99 ms and the second period T2 at 10 µs, when the charge quantity generated in the photoelectric converting portion 3 during the first period T1 is saturated, the output from the solid-state imaging device 1 may be defined as 1000 times an output based on the charge quantity generated in the photoelectric converting portion 3 during the second period T2. If the charge quantity generated in the photoelectric converting portion 3 during the first period T1 is not saturated, the output from the solid-state imaging device 1 may be defined as an output based on the sum of the charge quantity generated in the photoelectric converting portion 3 during the first period T1 and the charge quantity generated in the photoelectric converting portion 3 during the second period T2.

When the charge generated in the photoelectric converting portion 3 during the first period T1 is accumulated, since the exposure time is relatively long, strong incident light results in saturation of a signal and this makes appropriate detection difficult, whereas weak incident light is detected as a sufficiently large signal. On the other hand, when the charge generated in the photoelectric converting portion 3 during the second period T2 is accumulated, since the exposure time is relatively short, weak incident light results in a very weak signal and this makes sufficient signal detection difficult, whereas strong incident light is appropriately detected as a signal, without saturation. As described above, the solid-state imaging device 1 appropriately detects the incident light as a signal, regardless of the intensity of incident light, so as to increase the effective dynamic range.

In the present embodiment, the solid-state imaging device 1 is provided with the first or second shift register 9, 13. This configuration prevents the transfer of the charge generated in the photoelectric converting portion 3 during the second period T2 and the transfer of the charge generated in the photoelectric converting portion 3 during the first period T1 from impeding each other.

(Second Embodiment)

Figure 6:
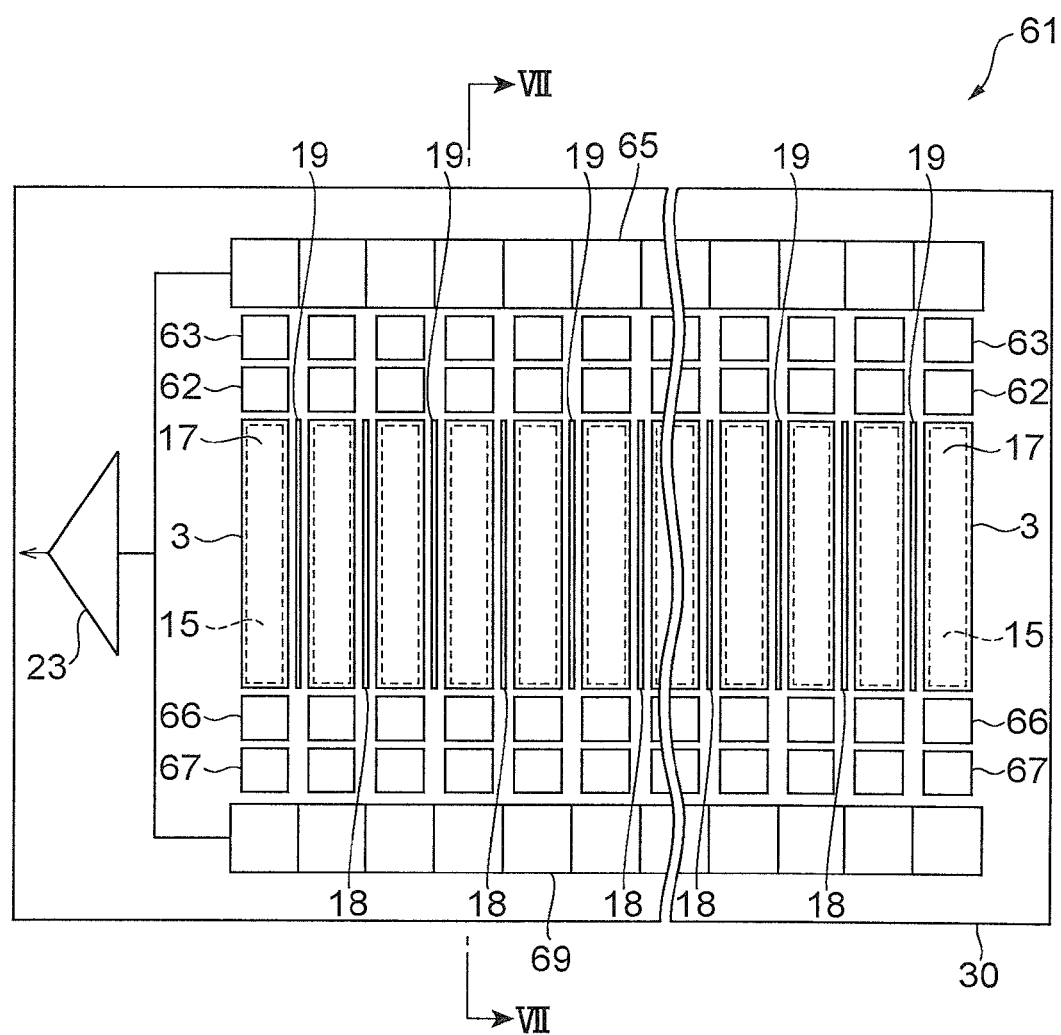
FIG. 6 is a drawing showing a configuration of a solid-state imaging device according to the second embodiment.
Figure 7:
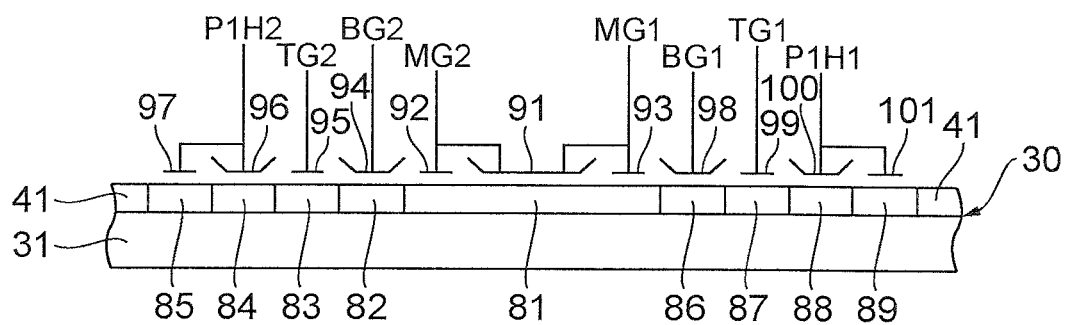
FIG. 7 is a drawing for explaining a sectional configuration along line VII-VII in FIG. 6.

FIG. 6 is a drawing showing a configuration of a solid-state imaging device according to the second embodiment. FIG. 7 is a drawing for explaining a sectional configuration along line VII-VII in FIG. 6.

The solid-state imaging device 61 according to the second embodiment is provided with a plurality of photoelectric converting portions 3, a plurality of first buffer gate portions 62, a plurality of first transfer portions 63, a first shift register 65 as a first charge output portion, a plurality of second buffer gate portions 66, a plurality of second transfer portions 67, and a second shift register 69 as a second charge output portion. The solid-state imaging device 61 can also be used as a light detecting means of a spectroscope as the aforementioned solid-state imaging device 1 can.

Each photoelectric converting portion 3 has a photosensitive region 15 and a potential gradient forming region 17. The potential gradient forming region 17 selectively forms a potential gradient increasing along either one direction of a first direction directed from one short side to the other short side forming the planar shape of the photosensitive region 15 and a second direction directed from the other short side to one short side forming the planar shape of the photosensitive region 15, in the photosensitive region 15. The first and second directions are directions along the long side direction of the photosensitive region 15. The potential gradient forming region 17 discharges a charge generated in the photosensitive region 15, from the other short side or one short side of the photosensitive region 15.

Each first buffer gate portion 62 is arranged corresponding to a photoelectric converting portion 3 and on the side of one short side forming the planar shape of the photosensitive region 15. Namely, the plurality of first buffer gate portions 62 are juxtaposed in a third direction intersecting with the first and second directions (i.e., in a direction along the short side direction of the photosensitive region 15), on the side of one short side forming the planar shape of the photosensitive region 15. The first buffer gate portion 62 is interposed between the photoelectric converting portion 3 (photosensitive region 15) and the first transfer portion 63. In the present embodiment, a charge discharged from the photosensitive region 15 by the potential gradient forming region 17 is accumulated in the first buffer gate portion 62. An isolation region (not shown) is arranged between adjacent first buffer gate portions 62 to substantialize electrical isolation between the first buffer gate portions 62.

Each first transfer portion 63 is arranged corresponding to a first buffer gate portion 62 and adjacent in the second direction to the corresponding first buffer gate portion 62. Namely, the plurality of first transfer portions 63 are also arranged corresponding to the respective photoelectric converting portions 3 and juxtaposed in the third direction on the side of one short side forming the planar shape of the photosensitive region 15. The first transfer portion 63 acquires a charge discharged from the photosensitive region 15 by the potential gradient forming region 17, from the first buffer gate portion 62 and transfers the acquired charge in the second direction. An isolation region (not shown) is arranged between adjacent first transfer portions 63 to substantialize electrical isolation between the first transfer portions 63.

The first shift register 65 is arranged to the plurality of first transfer portions 63 so as to be adjacent in the second direction to each of the first transfer portions 63. Namely, the first shift register 65 is arranged on the side of one short side forming the planar shape of the photosensitive region 15. The first shift register 65 receives charges transferred from the respective first transfer portions 63 and transfers the charges in the third direction to sequentially output them to the amplifier portion 23. The charges output from the first shift register 65 are converted into voltages by the amplifier portion 23 and the voltages of the respective photoelectric converting portions 3 (photosensitive regions 15) juxtaposed in the third direction are output to the outside of the solid-state imaging device 61.

Each second buffer gate portion 66 is arranged corresponding to a photoelectric converting portion 3 and on the side of the other short side forming the planar shape of the photosensitive region 15. Namely, the plurality of second buffer gate portions 66 are juxtaposed in the third direction on the side of the other short side forming the planar shape of the photosensitive region 15. The second buffer gate portion 66 is interposed between the photoelectric converting portion 3 (photosensitive region 15) and the second transfer portion 67. In the present embodiment, a charge discharged from the photosensitive region 15 by the potential gradient forming region 17 is accumulated in the second buffer gate portion 66. An isolation region (not shown) is arranged between adjacent second buffer gate portions 66 to substantialize electrical isolation between the second buffer gate portions 66.

Each second transfer portion 67 is arranged corresponding to a second buffer gate portion 66 and adjacent in the first direction to the corresponding second buffer gate portion 66. Namely, the plurality of second transfer portions 67 are also arranged corresponding to the respective photoelectric converting portions 3 and juxtaposed in the third direction on the side of the other short side forming the planar shape of the photosensitive region 15. The second transfer portion 67 acquires a charge discharged from the photosensitive region 15 by the potential gradient forming region 17, from the second buffer gate portion 66 and transfers the acquired charge in the first direction. An isolation region (not shown) is arranged between adjacent second transfer portions 67 to substantialize electrical isolation between the second transfer portions 67.

The second shift register 69 is arranged to the plurality of second transfer portions 67 so as to be adjacent in the first direction to each of the second transfer portions 67. Namely, the second shift register 69 is arranged on the side of the other short side forming the planar shape of the photosensitive region 15. The second shift register 69 receives charges transferred from the respective second transfer portions 67 and transfers the charges in the third direction to sequentially output them to the amplifier portion 23. The charges output from the second shift register 69 are converted into voltages by the amplifier portion 23 and the voltages of the respective photoelectric converting portions 3 (photosensitive regions 15) juxtaposed in the third direction are output to the outside of the solid-state imaging device 61.

The plurality of photoelectric converting portions 3, the plurality of first buffer gate portions 62, the plurality of first transfer portions 63, the first shift register 65, the plurality of second buffer gate portions 66, the plurality of second transfer portions 67, and the second shift register 69 are formed on a semiconductor substrate 30, as shown in FIG. 7. The semiconductor substrate 30 includes a p-type semiconductor layer 31, n-type semiconductor layers 81, 82, 83, 85, 86, 87, 89, n⁻-type semiconductor layers 84, 88, and a p⁺-type semiconductor layer 41 formed on one side of the p-type semiconductor layer 31.

The p-type semiconductor layer 31 and the n-type semiconductor layer 81 form a pn junction and the n-type semiconductor layer 81 constitutes the photosensitive region 15 which generates a charge with incidence of light. The n-type semiconductor layer 81, on a plan view, is of a nearly rectangular shape composed of two long sides and two short sides. A plurality of n-type semiconductor layers 81 are juxtaposed along a direction intersecting with the foregoing first direction (i.e., the direction along the long side direction of the n-type semiconductor layer 81 as directed from one short side to the other short side forming the planar shape of the n-type semiconductor layer 81) and are arranged in an array form in a one-dimensional direction. Of course, the n-type semiconductor layers 81 are also juxtaposed along a direction intersecting with the second direction (i.e., the direction along the long side direction of the n-type semiconductor layer 81 as directed from the other short side to one short side forming the planar shape of the n-type semiconductor layer 81). The n-type semiconductor layers 81 are juxtaposed in a direction along the short side direction of the n-type semiconductor layer 81, i.e., in the foregoing third direction. The aforementioned isolation region can also be comprised of a p⁺-type semiconductor layer.

A set of electrodes 91-93 are arranged for each n-type semiconductor layer 81. The set of electrodes 91-93 are made of an optically transparent material, e.g., a polysilicon film and is formed through an insulating layer (not shown) on the n-type semiconductor layer 32. The set of electrodes 91-93 constitute the potential gradient forming region 17. The electrodes 91-93 may be formed as continuously extending in the third direction so as to stretch across the plurality of n-type semiconductor layers 81 juxtaposed along the direction intersecting with the second direction. Of course, the electrodes 91-93 may be formed for each of the n-type semiconductor layers 81.

The electrode 91 constitutes a so-called resistive gate and is formed to extend in the direction directed from one short side to the other short side forming the planar shape of the n-type semiconductor layer 81 (the first direction) and in the direction directed from the other short side to one short side (the second direction). The electrode 91 is given a constant potential difference at its two ends to form a potential gradient according to an electric resistance component in the first or second direction of the electrode 91, i.e., a potential gradient increasing along the first or second direction. The electrode 92 is arranged adjacent in the second direction to the electrode 91. The electrode 93 is arranged adjacent in the first direction to the electrode 91. One end (end on the side of one short side) of the electrode 91 and the electrode 92 are given a signal MG2 from a control circuit (not shown) and the other end (end on the side of the other short side) of the electrode 91 and the electrode 93 are given a signal MG1 from the control circuit (not shown). When the signal MG1 is H level and the signal MG2 is L level, a potential gradient increasing along the first direction is formed in the n-type semiconductor layer 81. When the signal MG1 is L level and the signal MG2 is H level, a potential gradient increasing along the second direction is formed in the n-type semiconductor layer 81.

An electrode 94 is arranged adjacent in the second direction to the electrode 92. The electrode 94 is formed through an insulating layer (not shown) on the n-type semiconductor layer 82. The n-type semiconductor layer 82 is arranged on the side of one short side forming the planar shape of the n-type semiconductor layer 81. The electrode 94 is comprised, for example, of a polysilicon film. The electrode 94 is given a signal BG2 from the control circuit (not shown). The electrode 94 and the n-type semiconductor layer 82 below the electrode 94 constitute the first buffer gate portion 62.

A transfer electrode 95 is arranged adjacent in the second direction to the electrode 94. The transfer electrode 95 is formed through an insulating layer (not shown) on the n-type semiconductor layer 83. The n-type semiconductor layer 83 is arranged adjacent in the second direction to the n-type semiconductor layer 82. The transfer electrode 95 is comprised, for example, of a polysilicon film. The transfer electrode 95 is given a signal TG2 from the control circuit (not shown). The transfer electrode 95 and the n-type semiconductor layer 83 below the transfer electrode 95 constitute the first transfer portion 63.

A pair of transfer electrodes 96, 97 are arranged adjacent in the second direction to the transfer electrode 95. The transfer electrodes 96, 97 are formed through an insulating layer (not shown) on the n⁻-type semiconductor layer 84 and on the n-type semiconductor layer 85, respectively. The n⁻-type semiconductor layer 84 and the n-type semiconductor layer 85 are arranged adjacent in the second direction to the n-type semiconductor layer 83. The transfer electrodes 96, 97 are comprised, for example, of a polysilicon film. The transfer electrodes 96, 97 are given a signal P1H2 or the like from the control circuit (not shown). The transfer electrodes 96, 97 and the n⁻-type semiconductor layer 84 and n-type semiconductor layer 85 below the transfer electrodes 96, 97 constitute the first shift register 65.

An electrode 98 is arranged adjacent in the first direction to the electrode 93. The electrode 98 is formed through an insulating layer (not shown) on the n-type semiconductor layer 86. The n-type semiconductor layer 86 is arranged on the side of the other short side forming the planar shape of the n-type semiconductor layer 81. The electrode 98 is comprised, for example, of a polysilicon film. The electrode 98 is given a signal BG1 from the control circuit (not shown). The electrode 98 and the n-type semiconductor layer 86 below the electrode 98 constitute the second buffer gate portion 66.

A transfer electrode 99 is arranged adjacent in the first direction to the electrode 98. The transfer electrode 99 is formed through an insulating layer (not shown) on the n-type semiconductor layer 87. The n-type semiconductor layer 87 is arranged adjacent in the first direction to the n-type semiconductor layer 86. The transfer electrode 99 is comprised, for example, of a polysilicon film. The transfer electrode 99 is given a signal TG1 from the control circuit (not shown). The transfer electrode 99 and the n-type semiconductor layer 87 below the transfer electrode 99 constitute the second transfer portion 67.

A pair of transfer electrodes 100, 101 are arranged adjacent in the first direction to the transfer electrode 99. The transfer electrodes 100, 101 are formed through an insulating layer (not shown) on the n⁻-type semiconductor layer 88 and on the n-type semiconductor layer 89, respectively. The n⁻-type semiconductor layer 88 and the n-type semiconductor layer 89 are arranged adjacent in the first direction to the n-type semiconductor layer 87. The transfer electrodes 100, 101 are comprised, for example, of a polysilicon film. The transfer electrodes 100, 101 are given a signal P1H1 or the like from the control circuit (not shown). The transfer electrodes 100, 101 and the n⁻-type semiconductor layer 88 and n-type semiconductor layer 89 below the transfer electrodes 100,101 constitute the second shift register 69.

The p⁺-type semiconductor layer 41 electrically isolates the n-type semiconductor layers 81, 82, 83, 85, 86, 87, 89 and the n⁻-type semiconductor layers 84, 88 from the other portions of the semiconductor substrate 30. Each of the aforementioned insulating layers is made of an optically transparent material, e.g., a silicon oxide film. In order to prevent occurrence of unwanted charge, the n-type semiconductor layers 82, 83, 85, 86, 87, 89 and the n⁻-type semiconductor layers 84, 88 (first buffer gate portion 62, first transfer portion 63, first shift register 65, second buffer gate portion 66, second transfer portion 67, and second shift register 69) except for the n-type semiconductor layer 81 are preferably shielded from light, for example, by arranging a light shield member.

Figure 8:
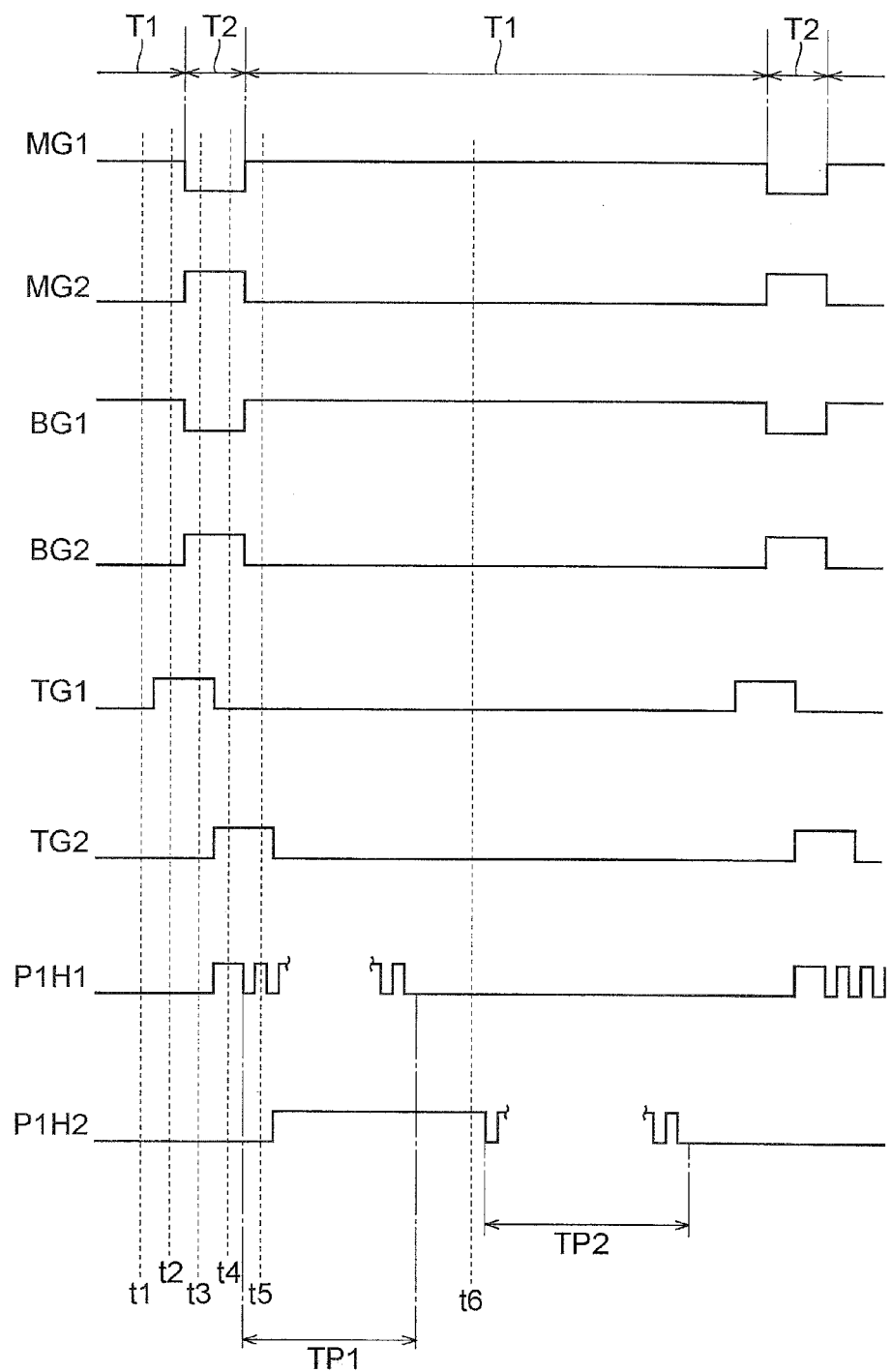
FIG. 8 is a timing chart of input signals in the solid-state imaging device of the second embodiment.
Figure 9:
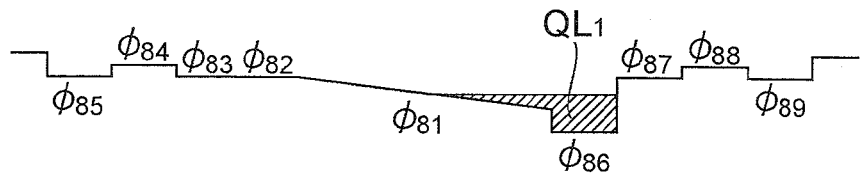
FIG. 9 is potential diagrams for explaining charge accumulation and discharge operations at respective times in FIG. 8.
Figure 9:
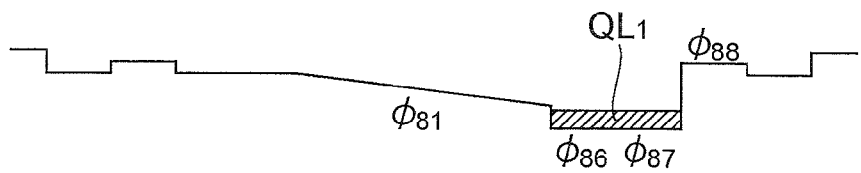
Figure 9:
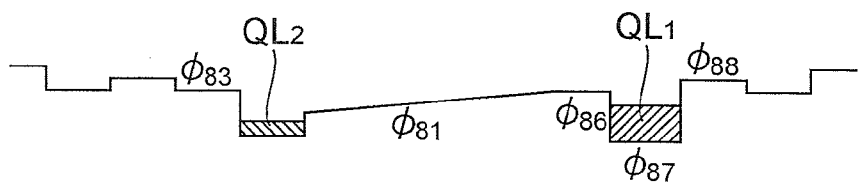
Figure 9:
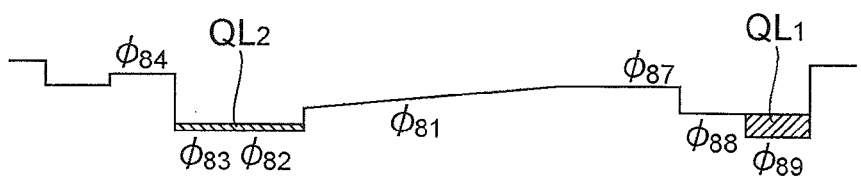
Figure 9:
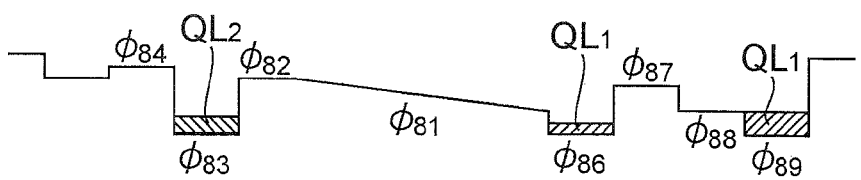
Figure 9:
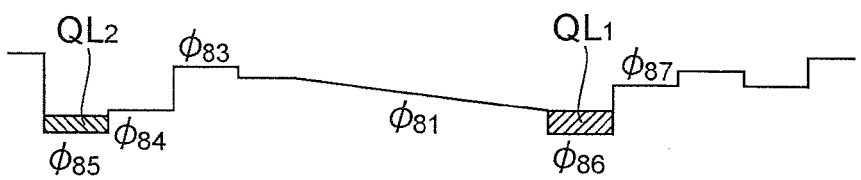

The operations in the solid-state imaging device 61 will be described below on the basis of FIGS. 8 and 9. FIG. 8 is a timing chart of the signals MG1, MG2, BG1, BG2, TG1, TG2, P1H1, and P1H2 fed to the electrodes 91-101 in the solid-state imaging device 61 of the present embodiment. FIG. 9(a) to (f) are potential diagrams for explaining the charge accumulation and discharge operations at respective times t1-t6 in FIG. 8.

As shown in FIG. 8, at time t1, the signals MG1, BG1 are H level and the signals MG2, BG2, TG1, TG2, P1H1, P1H2 are L level, whereby the potential gradient increasing along the first direction is formed in the n-type semiconductor layer 81 and the potential $\Phi_{81}$ is inclined so as to deepen toward the n-type semiconductor layer 86, thus forming the gradient of the potential $\Phi_{81}$ (cf. FIG. 9(a)). At this time, since the potential $\Phi_{86}$ of the n-type semiconductor layer 86 is deeper than the potential $\Phi_{87}$ of the n-type semiconductor layer 87, a well of the potential $\Phi_{86}$ is formed. In this state, when light is incident to the n-type semiconductor layer 81 to generate a charge, the generated charge migrates in the first direction along the gradient of the potential $\Phi_{81}$, as also shown in FIG. 5, to be accumulated in the wells of the potentials $\Phi_{81}$, $\Phi_{86}$. A charge quantity $QL_1$ is accumulated in the potentials $\Phi_{81}$, $\Phi_{86}$.

At time t2, the signal TG1 is H level to deepen the potential $\Phi_{87}$ of the n-type semiconductor layer 87 and form a well of the potentials $\Phi_{86}$, $\Phi_{87}$ (cf. FIG. 9(b)). The charge quantity $QL_1$ is accumulated in the potentials $\Phi_{86}$, $\Phi_{87}$.

At time t3, the signals MG1, BG1 are L level and the signals MG2, BG2 are H level, whereby the potential gradient increasing along the second direction is formed in the n-type semiconductor layer 81 and the potential $\Phi_{81}$ is inclined so as to deepen toward the n-type semiconductor layer 82, thereby forming the gradient of the potential $\Phi_{81}$ (cf. FIG. 9(c)). At this time, since the potential $\Phi_{82}$ of the n-type semiconductor layer 82 is deeper than the potential $\Phi_{83}$ of the n-type semiconductor layer 83, a well of the potential $\Phi_{82}$ is formed. In this state, when light is incident to the n-type semiconductor layer 81 to generate a charge, the generated charge migrates in the second direction along the gradient of the potential $\Phi_{81}$ to be accumulated in the well of the potential $\Phi_{82}$. A charge quantity $QL_2$ is accumulated in the potential $\Phi_{82}$. Since the potential $\Phi_{86}$ becomes shallower, the charge in the charge quantity $QL_1$ is accumulated in the well of the potential $\Phi_{87}$.

At time t4, the signal TG1 is L level and the signal P1H1 is H level, to shallow the potential $\Phi_{87}$ and deepen each of the potentials $\Phi_{88}$, $\Phi_{89}$ of the n⁻-type semiconductor layer 88 and the n-type semiconductor layer 89, thereby forming a well of the potential $\Phi_{89}$ (cf. FIG. 9(d)). The charge accumulated in the well of the potential $\Phi_{87}$ is transferred into the well of the potential $\Phi_{89}$. The charge quantity $QL_1$ is accumulated in the potential $\Phi_{89}$. After this, the charge in the charge quantity $QL_1$ is sequentially transferred in the third direction during a charge transfer period TP1 to be output to the amplifier portion 23. During the charge transfer period TP1, a signal for transferring the charge quantity $QL_1$ in the third direction is given as signal P1H1 or the like.

At time t4, the signal TG2 is H level to deepen the potential $\Phi_{83}$ of the n-type semiconductor layer 83, thus forming a well of potentials $\Phi_{82}$, $\Phi_{83}$ (cf. FIG. 9(d)). The charge quantity $QL_2$ is accumulated in the potentials $\Phi_{82}$, $\Phi_{83}$.

At time t5, the signal BG2 is L level to shallow the potential $\Phi_{82}$, whereby the charge in the charge quantity $QL_2$ is accumulated in the well of the potential $\Phi_{83}$ (cf. FIG. 9(e)).

At time t5, the signals MG1, BG1 are H level to form the gradient of the potential $\Phi_{81}$ (gradient inclined so as to deepen toward the n-type semiconductor layer 86) and to form the well of potential $\Phi_{86}$ as at time t1. Therefore, when light is incident to the n-type semiconductor layer 81 to generate a charge, the generated charge migrates in the first direction along the gradient of the potential $\Phi_{81}$ to be accumulated in the well of the potential $\Phi_{86}$. The charge quantity $QL_1$ is accumulated in the potential $\Phi_{86}$.

At time t6, the signal P1H2 is H level to deepen each of the potentials $\Phi_{84}$, $\Phi_{85}$ of the n⁻-type semiconductor layer 84 and the n-type semiconductor layer 85, thereby forming a well of the potential $\Phi_{85}$ (cf. FIG. 9(f)). The charge accumulated in the well of the potential $\Phi_{83}$ is transferred into the well of the potential $\Phi_{85}$. The charge quantity $QL_2$ is accumulated in the potential $\Phi_{85}$. After this, the charge in the charge quantity $QL_2$ is sequentially transferred in the third direction during a charge transfer period TP2 to be output to the amplifier portion 23. During the charge transfer period TP2, a signal for transferring the charge quantity $QL_2$ in the third direction is given as signal P1H2 or the like.

At time t6, the signal P1H1 is L level to shallow each of the potentials $\Phi_{88}$, $\Phi_{89}$. At this time, since the state in which the gradient of the potential $\Phi_{81}$ is formed is maintained, when light is incident to the n-type semiconductor layer 81 to generate a charge, the generated charge migrates in the first direction along the gradient of the potential $\Phi_{81}$ to be accumulated in the well of the potential $\Phi_{86}$.

In the present embodiment, as described above, since in each photoelectric converting portion 3 the electrode 91 forms the potential gradient increasing along the first direction or the second direction, the charge generated in the photosensitive region 15 migrates toward the other or one short side along the slope of potential according to the potential gradient formed. This makes the charge migration speed dominated by the potential gradient (slope of potential), so as to increase the charge readout speed.

The charge having migrated to the other short side is accumulated in the second buffer gate portion 66. The charge accumulated in the second buffer gate portion 66 is acquired by the second transfer portion 67 to be transferred in the first direction. The charges transferred from the respective second transfer portions 67 are transferred in the third direction by the second shift register 69 to be output. The charge having migrated to one short side is accumulated in the first buffer gate portion 62. The charge accumulated in the first buffer gate portion 62 is acquired by the first transfer portion 63 to be transferred in the first direction. The charges transferred from the respective first transfer portions 63 are transferred in the third direction by the first shift register 65 to be output. In this manner, the charges transferred from the plurality of photoelectric converting portions 3 are acquired by the first or second shift register 65, 69 to be transferred in the third direction. As a consequence of this, the solid-state imaging device 61 does not have to execute further signal processing for obtaining a one-dimensional image, whereby image processing can be prevented from becoming complicated.

In the present embodiment, the device is also configured to continuously and alternately output the charge (charge quantity $QL_{-1}$) generated in the photoelectric converting portion 3 (photosensitive region 15) during the first period (period T1 in FIG. 8) and the charge (charge quantity $QL_2$) generated in the photoelectric converting portion 3 (photosensitive region 15) during the second period (period T2 in Fig. 8). As a result of this, as in the case of the first embodiment, the solid-state imaging device 61 appropriately detects the incident light as a signal, regardless of the intensity of incident light, to increase the effective dynamic range.

Since the solid-state imaging device 61 is provided with the first or second shift register 65, 69, it can prevent the transfer of the charge generated in the photoelectric converting portion 3 during the second period T2 and the transfer of the charge generated in the photoelectric converting portion 3 during the first period T1 from impeding each other.

The above described the preferred embodiments of the present invention, but it should be noted that the present invention is by no means intended to be limited to the above-described embodiments but can be modified in various ways without departing from the scope and spirit of the invention.
Industrial Applicability The present invention is applicable to the light detecting means of the spectroscope.

The invention claimed is:
1. A solid-state imaging device comprising:
a plurality of photoelectric converting portions, each having a photosensitive region which generates a charge according to incidence of light and which has a planar shape of a nearly rectangular shape composed of two long sides and two short sides and a potential gradient forming region which forms a potential gradient increasing along a predetermined direction parallel to the long sides forming the planar shape of the photosensitive region, in the photosensitive region, the plurality of photoelectric converting portions being juxtaposed along a direction intersecting with the predetermined direction; and
first and second charge output portions which acquire charges transferred from the respective photoelectric converting portions and which transfer the charges in the direction intersecting with the predetermined direction to output the charges,
wherein the potential gradient forming region forms the potential gradient increasing along a first direction directed from one short side to the other short side forming the planar shape of the photosensitive region, as the predetermined direction, and
wherein the first and second charge output portions are arranged on the side of the other short side forming the planar shape of the photosensitive region,
the solid-state imaging device further comprising:
a plurality of first transfer portions, each being arranged corresponding to the photoelectric converting portion and between each said photoelectric converting portion and the first charge output portion, and each transferring a charge from the photosensitive region of the corresponding photoelectric converting portion to the first charge output portion; and
a plurality of second transfer portions, each being arranged corresponding to the photoelectric converting portion and between each said first charge output portion and the second charge output portion, and each transferring a charge transferred to the first charge output portion, to the second charge output portion.
2. A solid-state imaging device comprising:
a plurality of photoelectric converting portions, each having a photosensitive region which generates a charge according to incidence of light and which has a planar shape of a nearly rectangular shape composed of two long sides and two short sides, and a potential gradient forming region which forms a potential gradient increasing along a predetermined direction parallel to the long sides forming the planar shape of the photosensitive region, in the photosensitive region the plurality of photoelectric converting portions being juxtaposed along a direction intersecting with the predetermined direction; and
first and second charge output portions which acquire charges transferred from the respective photoelectric converting portions and which transfer the charges in the direction intersecting with the predetermined direction to output the charges
wherein the potential gradient forming region selectively forms the potential gradient increasing along either one direction of a first direction directed from one short side to the other short side forming the planar shape of the photosensitive region and a second direction directed from the other short side to one short side forming the planar shape of the photosensitive region, as the predetermined direction, wherein the first charge output portion is arranged on the side of one short side forming the planar shape of the photosensitive region, and wherein the second charge output portion is arranged on the side of the other short side forming the planar shape of the photosensitive region, the solid-state imaging device further comprising:

a plurality of first transfer portions, each being arranged corresponding to the photoelectric converting portion and between each said photoelectric converting portion and the first charge output portion, and each transferring a charge from the photosensitive region of the corresponding photoelectric converting portion to the first charge output portion; and a plurality of second transfer portions, each being arranged corresponding to the photoelectric converting portion and between each said photoelectric converting portion and the second charge output portion, and each transferring a charge from the photosensitive region of the corresponding photoelectric converting portion to the second charge output portion.

3. The solid-state imaging device according to claim 1, wherein the second charge output portion acquires charges generated in the photoelectric converting portions, from the plurality of second transfer portions during a first period and transfers the charges in the direction intersecting with the predetermined direction to output the charges, and wherein the first charge output portion acquires charges generated in the photoelectric converting portions, from the plurality of first transfer portions during a second period shorter than the first period and transfers the charges in the direction intersecting with the predetermined direction to output the charges.

4. The solid-state imaging device according to claim 2, wherein the second charge output portion acquires charges generated in the photoelectric converting portions, from the plurality of second transfer portions during a first period and transfers the charges in the direction intersecting with the predetermined direction to output the charges, and wherein the first charge output portion acquires charges generated in the photoelectric converting portions, from the plurality of first transfer portions during a second period shorter than the first period and transfers the charges in the direction intersecting with the predetermined direction to output the charges.

* * * * *

UNITED STATES PATENT AND TRADEMARK OFFICE
CERTIFICATE OF CORRECTION

PATENT NO. : 8,446,500 B2  
APPLICATION NO. : 12/990051  
DATED : May 21, 2013  
INVENTOR(S) : Suzuki et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 182 days.

Signed and Sealed this
Eighth Day of September, 2015

Michelle K. Lee
*Director of the United States Patent and Trademark Office*